US010608613B1

(12) United States Patent
DiMarzio et al.

(10) Patent No.: US 10,608,613 B1
(45) Date of Patent: Mar. 31, 2020

(54) NON-RECIPROCAL BAND PASS FILTER

(71) Applicant: NORTHROP GRUMMAN SYSTEMS CORPORATION, Falls Church, VA (US)

(72) Inventors: Donald DiMarzio, Northport, NY (US); Stephane Larouche, Redondo Beach, CA (US); Vesna Radisic, Hermosa Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 16/434,596

(22) Filed: Jun. 7, 2019

(51) Int. Cl.
*H03H 21/00* (2006.01)
*H03H 11/04* (2006.01)
*G01S 7/03* (2006.01)

(52) U.S. Cl.
CPC ............ *H03H 11/04* (2013.01); *G01S 7/03* (2013.01); *H03H 2210/025* (2013.01); *H03H 2210/026* (2013.01); *H03H 2210/033* (2013.01)

(58) Field of Classification Search
CPC .... G01S 7/03; H03H 11/04; H03H 2210/025; H03H 2210/026; H03H 2210/033
See application file for complete search history.

(56) References Cited

U.S. PATENT DOCUMENTS 10,090,585 B2 * 10/2018 Dinc .................. H04B 1/06
10,327,026 B1 * 6/2019 Mishra .............. H04N 21/2668

OTHER PUBLICATIONS

Y. Hadad, J.C. Soric, and Andrea Alu, "Breaking temporal symmetries for emission and absorption", PNAS, Mar. 29, 2016, vol. 113, No. 13, 3471-3475.
F. Monticone and A. Alù, "Review: Metamaterial, plasmonic and nanophotonic devices", Rep. Prog. Phys. 80, Feb. 6, 2017, 036401 (37pp).
A. Hessel and A.A. Oliner, "Wave Propagation in a Medium with a Progressive Sinusoidal Disturbance", IRE Transactions on Microwave Theory and Techniques, p. 337, 1961.
N. Chamanara, S. Taravati, Z. Deck-Léger, and C. Caloz, "Optical isolation based on space-time engineered asymmetric photonic band gaps", Physical Review B 96, 155409 (2017).
S.Y. Elnaggar and G.N. Milford, "Controlling Nonreciprocity Using Enhanced Brillouin Scattering", IEEE Transactions on Antennas and Propagation, vol. 66, No. 7, Jul. 2018.

(Continued)

*Primary Examiner* — Dinh T Le
(74) *Attorney, Agent, or Firm* — John A. Miller; Schumaker, Loop & Kendrick, LLP

(57) ABSTRACT

A non-reciprocal band pass filter including a transmission line having a plurality of repeating finite size unit cells, where each unit cell has a predetermined length and includes an inductor and a varactor. The filter also includes a signal source providing a transmission signal that propagates on the transmission line, and a modulation source providing a modulation signal that modulates the varactor. A ratio between the predetermined length of the unit cells and a frequency of the modulation signal is selected to provide propagation modes that allow the transmission signal to propagate along the transmission line in one direction in a controlled pass band, but prevent the transmission signal from propagating along the transmission line in the opposite direction in the controlled pass band.

19 Claims, 9 Drawing Sheets

(56) References Cited

OTHER PUBLICATIONS

S. Taravati, N. Chamanara and C. Caloz, "Nonreciprocal Electromagnetic Scattering from a Periodically Space-Time Modulated Slab and Application to a Quasi-Sonic Isolator", Physical Review B 96, 165144 (2017).
S. Qin, Q. Xu and Y.E. Wang, "Nonreciprocal Components with Distributedly Modulated Capacitors", IEEE Transactions on Microwave Theory and Techniques, vol. 62, No. 10, Oct. 2014.

* cited by examiner

US 10,608,613 B1

NON-RECIPROCAL BAND PASS FILTER

BACKGROUND

Field

This invention relates generally to a non-reciprocal band pass filter including finite unit cells and, more particularly, to a non-reciprocal band pass filter including a transmission line having a plurality of repeating finite unit cells, where a ratio between a length of the unit cells and the wavelength of a modulation signal are selected to provide propagation modes that allow a transmission signal to propagate within the pass band along the transmission line in one direction, but prevent the transmission signal within that band from propagating along the transmission line in the opposite direction.

Discussion

It is often desirable to design certain circuits and devices, such as radar systems, isolators and circulators, so that they only allow the flow of RF or electromagnetic energy in one direction, i.e., are non-reciprocal. It is also usually desirable that these types of circuits be compact and be configured as an integrated circuit on a chip. For example, it is often necessary to provide a circuit that allows an electromagnetic signal to be transmitted at a certain frequency, but prevents the circuit from receiving electromagnetic signals at that frequency, i.e., breaks the reciprocity of the circuit.

Traditionally, these types of circuits and devices have relied on bulk magnetic materials to break spatial symmetry to control the flow of RF energy. Modern radar systems and communications systems depend on integrated front-end receivers requiring on-chip high speed and high power circuitry. Bulk magnetic materials, such as ferrites, do not lend themselves to integration on this scale. Nonmagnetic alternatives for reciprocity breaking are needed if this level of compact integration is to be achieved. Likewise, optical isolation has been achieved through Faraday rotation using bulk crystals, which are not convenient for photonic systems integration. Dramatic growth has recently been observed in the development of concepts for wideband and low-loss nonmagnetic isolators that hold the possibility for RF and photonic systems integration.

A simple way to enable preferential or one-way flow of electromagnetic energy is to "bias" a proposed isolator material to give it a preferential direction. One way to do this is to propagate a modulation wave through a nonlinear material or transmission line structure so that energy is coupled between the modulation wave and a signal wave to be controlled. The transmission characteristics of the signal wave depend on its direction of flow relative to the modulation wave direction. This is analogous to the concept of using a paddle wheel to control the flow of water in a stream. If water as a signal wave flows along the direction of the moving paddles as a modulation wave the water is passed through, but if the water direction is reversed then it flows against the paddle motion and is blocked. This analogy can be extended by varying the paddle speed, i.e., the modulation wave phase velocity, relative to the water speed. If the water flows with the paddles, then there will be some water reflected back, but with a somewhat lower energy, i.e., down conversion, while for water flowing against the paddles the water is blocked and reflected back at a higher energy, i.e., up conversion. The net effect on the water flow will also depend on whether the paddle speed is greater or less than the water speed.

The basic foundation of the impact of a periodic space-time modulated medium on electromagnetic waves is well known, including space-time modulated continuous media using transmission line theory and the realization that space-time modulation can lead to magnet free reciprocity breaking and signal isolation. Recognizing that non-reciprocity in a weakly space-time modulated media would require only a few modulation harmonics to model wave propagation with sufficient precision, a three-wave method has been proposed to approximate the system for relatively high speed modulation, i.e., modulation frequency greater than the signal. This was accomplished only for nondispersive continuous right-handed media. It has been recognized that dispersion engineering can be used to control and possibly enhance the ability of a space-time modulated medium to efficiently block waves in the reverse direction over a short path while enhancing transmission in the forward direction. In this context, dispersion engineering can refer to the incorporation of left-handed or negative index characteristic and/or more complex equivalent circuit structures accounting for finite unit cell dimensions.

DETAILED DESCRIPTION OF THE EMBODIMENTS

The following discussion of the embodiments of the invention directed to a non-reciprocal band pass filter including finite size unit cells is merely exemplary in nature, and is in no way intended to limit the invention or its applications or uses.

Figure 1:
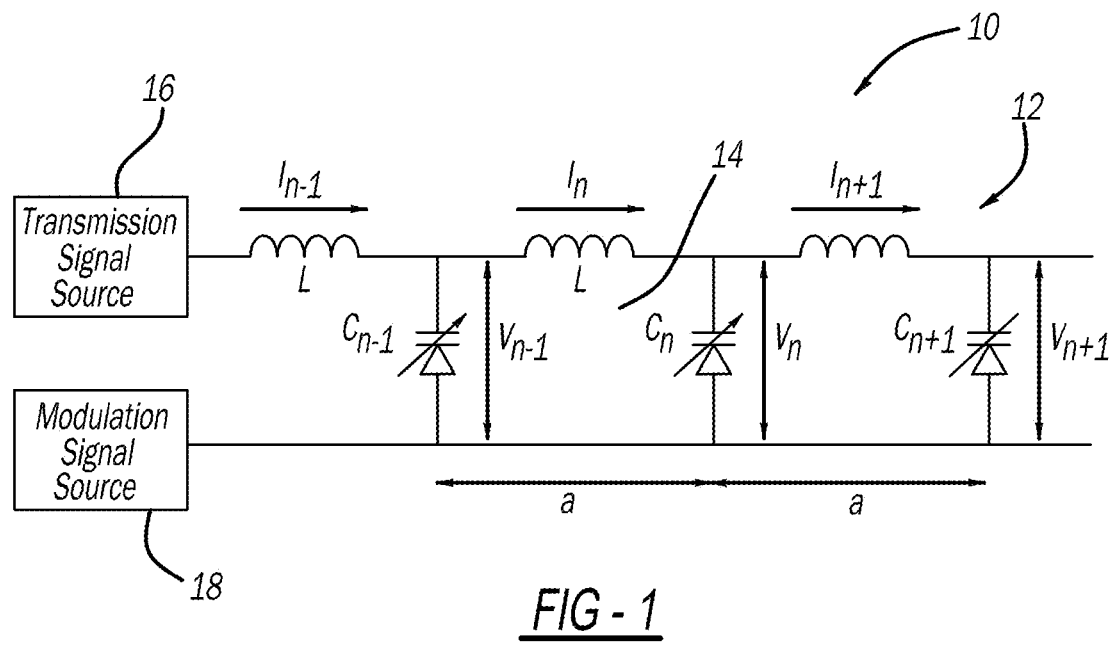
FIG. 1 is a schematic diagram of a non-reciprocal band pass filter including a right handed one-dimensional transmission line structure including a plurality of finite size unit cells with varactors that are modulated separately from the signal wave.

FIG. 1 is a schematic diagram of a non-reciprocal band pass filter 10 including a right handed one-dimensional non-reciprocal transmission line structure 12 having a plurality of finite unit cells 14, here three, each including a cell length a, an independently modulated capacitance $C_n$, for example, a varactor, and a constant inductance L. In practice, the transmission line structure 12 would have many of the cells 14 and can be considered infinitely long mathematically. The filter 10 further includes a transmission signal source 16 that provides a transmission signal that is being filtered and propagates on the transmission line structure 12 from left to right and a modulation signal source 18 that provides a modulation signal that controls the capacitance of the capacitors C to modulate the transmission signal. The modulation signal is shown as propagating in the same direction as the transmission signal, but can also propagate in an opposite direction to the transmission signal. The following is a discussion for modeling a realistic equivalent circuit with the finite unit cell length a for the right handed space-time modulated transmission line structure that leads to developing a non-reciprocal band pass filter that does not employ bulky magnetic materials.

The Bloch-Floquet expansion of the wave solution can be used in a periodic potential to include periodicity in both time and space to analyze the transmission line structure 12. The Floquet theorem states that a general solution to the wave equation in an infinite medium that is modulated by a periodic potential can be written as a product of a plane wave and a function with the same periodicity of the modulation. In this case, the periodicity of the structure 12 can be generalized to include both space and time modulation. The general form of the solution is given by:

$$V(z,t) = \exp[-i(wt-kz)]F(z,t), \quad (1)$$

where w is a positive frequency having a real value, k is a complex wave vector and F(z,t) is a function with the same space and time periodicity as the modulation, and can be expressed as the series expansion:

$$F(z,t) = \Sigma_s V_s \exp[-is(w_m t - k_m z)], \quad (2)$$

where s is a harmonic integer and the time and space periodicity of the potential is given by the value of the modulation signal frequency $w_m$ and the value of the complex modulation signal wave vector $k_m$, and where each term in the expansion of function F is a harmonic in time and space.

Using Kirchoff's law the relationship between the currents $I_n$ and the voltages V(n, t) in the structure 12 can be derived, and by expressing the wave equation in terms of voltage V(n, t) as a function of cell position n and time t gives:

$$L\frac{d^2}{dt^2}[C(n,t)V(n,t)] = V(n+1,t) + V(n-1,t) - 2V(n,t). \quad (3)$$

In equation (3), the potential distribution is represented by the space and time varying capacitance C(n, t). As was done in the known art, the periodic modulation of the capacitance C is given by the simple expression:

$$C(n,t)=C_0+C_m \cos[w_m t - k_m n a], \quad (4)$$

where $C_0$ is a constant background capacitance, $C_m$ is the capacitance modulation, and the product no equals the position z of the unit cell 14 along the one-dimensional transmission line structure 12. Equating common terms in the expanded Floquet solution, the following recursion relation among the Floquet expansion coefficients $V_s$ is given as:

$$V_{s-1}+D_s V_s + V_{s+1}=0, \quad (5)$$

and:

$$D_s=2/M[1-4/LC_0[\sin^2[(k+sk_m)a/2]/(w+sw_m)^2], \quad (6)$$

where the modulation factor $M=C_m/C_0$, and where $D_s$ is the generalized recursion term for a right-handed transmission line with a finite unit cell length of cell length a. This results in a natural dispersion that is not present in the previously studied continuous (a=0) modulated transmission lines, and now also imposes an upper cut-off frequency. For small values of unit cell length a, equation (6) reduces to the previously derived expressions for a space-time modulated continuous right-handed transmission line.

Using equations (5) and (6), a continuous fraction relation can be derived as:

$$f_s(k,w)=D_s-1/(D_{s+1}-1/(D_{s+2}-\ldots))-1/(D_{s-1}-1/(D_{s-2}-\ldots)). \quad (7)$$

Solving equation (7) for $f_s(k_N, w_N)=0$ gives the dispersion relation between the frequency w and the wave vector k centered around a selected center harmonic s. Equation (7) is traditionally set to the zero order harmonic (s=0) and then only low order harmonics (e.g., s=−1 and s=+1) are kept in the continual fraction assuming a small to moderate modulation factor M. This approximation is equivalent to a known three-wave mixing approach to model a continuous space-time modulated transmission line.

Equation (6) can be cast in a purely dimensionless form to derive a set of universal dispersion curves which can be used calculate curves for a specific set of transmission line component parameters. The dimensionless (normalized) variables can be defined as:

$$k_N=2\pi k/k_m,$$

$$w_N=2\pi w/k_m v_0. \quad (8)$$

Equation (6) can be transformed into:

$$D_s = 2/M\left[1-4/p^2\left[\sin^2\left[\left(\frac{p}{2}\right)(k_N+2\pi s)\right]/(w_N+2\pi rs)^2\right], \quad (9)$$

where $p=k_m a/2\pi$, $r=v_m/v_0$, $v_m=w_m/k_m$ and $v_0=a/\sqrt{LC_0}$, and where $v_0$ represents the phase velocity of the transmission signal for no space-time pump modulation and with the signal wavelength large compared to the unit cell length a, $v_m$ is the equivalent phase velocity of the space-time modulation wave, and the r factor is the ratio of these two velocities.

The newly introduced parameter p is equivalent to the ratio of the transmission line unit cell length a to the spatial modulation wavelength. In the other words, the parameter p is a ratio between the unit cell length a and the wavelength λ of the modulation signal. The p factor introduces an additional control over the overall system dispersion and results in both multi-gap dispersion and enhancements in attenuation for waves with frequencies within a stop band.

In order to graphically solve for the dispersion relation, equation (7) can be recast using the dimensionless form of the recursion term $D_s$ given by equation (9), and then the log of the absolute value (ABS) of $f_s(k_N, w_N)$ can be plotted for a grid of (k, w) pairs for a selected range of the wave vector $k_N$ values and the frequency $w_N$ values. The frequency $w_N$ values are defined to be positive real numbers, but in general the $k_N$ wave vector values are complex. For this reason, the $(k_N, w_N)$ grid is plotted for the real and imaginary parts of the wave vector $k_N$ separately. Since the transmission line structure 12 is lossless, the propagating wave solutions for various values of the real part of the wave vector $k_N$ with the imaginary part of the wave vector $k_N$ being zero are first found. Likewise, attenuating wave solutions are obtained, where the wave vector $k_N$ has both a real (fixed) and an imaginary component. The utility of plotting $f_s(k_N, w_N)$ values is now apparent, where a 2D color or gray scale plot of $f_s(k_N, w_N)$ will display the minimum, and hence the dispersion solution of $f_s(k_N, w_N)=0$.

Figure 2:
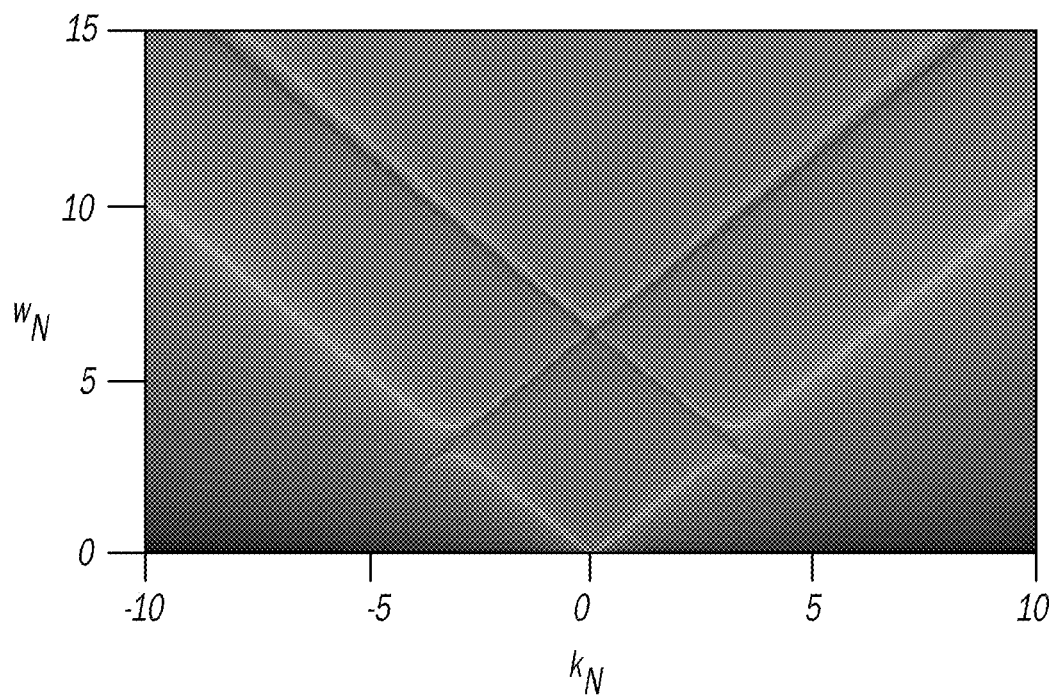
FIG. 2 is a graph with normalized real wave vector on the horizontal axis and normalized frequency on the vertical axis showing a gray scale plot of the dispersion relation between the real part of the wave vector and the wave frequency for a non-reciprocal time and spatially modulated finite size unit cell transmission line, where the cell length is small compared to a spatial modulation period using a first order harmonic approximation.
Figure 3:
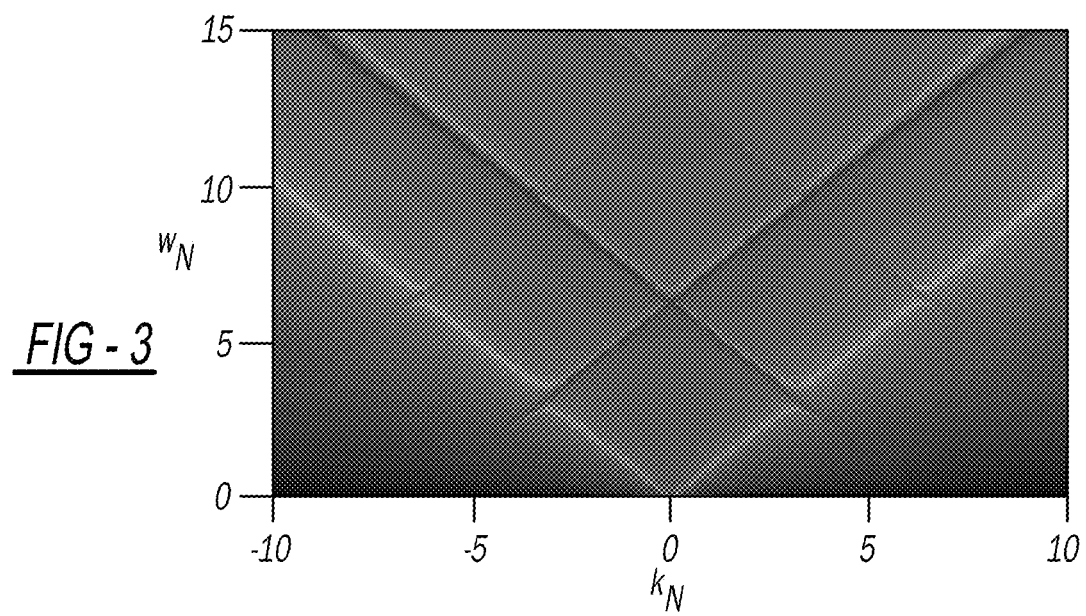
FIG. 3 is a graph with normalized real wave vector on the horizontal axis and normalized frequency on the vertical axis showing a gray scale plot of the dispersion relation between the real part of the wave vector and the wave frequency for a non-reciprocal time and spatially modulated finite size unit cell transmission line, where the cell length is small compared to a spatial modulation period using a second order harmonic approximation.

FIGS. 2 and 3 are graphs with the complex wave vector $k_N$ on the horizontal axis and the frequency $w_N$ on the vertical axis showing a gray scale plot for dispersion of the real part of the wave vector $k_N$ on a time-static but spatially modulated transmission line with a unit cell length that is small compared to a spatial modulation period. Particularly, FIGS. 2 and 3 show a gray scale plot for log ABS [$f_s(k_N, w_N)$] for the real part of the wave vector $k_N$ and the center harmonic s=0, with single order harmonic (s=−1, +1) approximation shown in FIG. 2 and second order harmonic approximation (s=−2, −1, +1, +2) shown in FIG. 3 in the recursion term $D_s$ to truncate equation (7). In this example, r=0 ($w_m$=0) is set, and a<<spatial modulation period ($\lambda_m=2\pi/k_m$).

The light lines in FIGS. 2 and 3 represent the minimum values of log ABS [$f_s(k_N, w_N)$], and therefore, the dispersion solution or Brillouin zone depiction of equation (7), where the −1 and +1 harmonic lines intersect the 0 order lines, and band gaps form as expected at the zone boundaries (FIG. 2). When the second order −2 and +2 harmonics are added to the approximation, two additional dispersion lines are now observed with additional band gaps at the intersections (FIG. 3).

Because it is assumed no time modulation (r=0 or $w_m$=0), the dispersion is reciprocal with respect to the sign of the modulation signal vector $k_N$. The addition of higher-order harmonics results in additional dispersion lines and band gaps appearing above the 0 order dispersion lines in FIGS. 2 and 3. The absence of a repeated Brillouin zone structure to the left and right of the zero order lines in FIGS. 2 and 3 is due to selecting s=0 in equation (7). If s=−1 or +1 is selected this would result in a lateral translation of the origin of the pattern shown in FIGS. 2 and 3 to the left or the right. If these are included in all of the higher order solutions the entire repeated Brillouin zone scheme for the transmission line structure 12 can be obtained. For the purposes in the remaining discussion it is only necessary to stay with the s=0 starting origin in equation (7).

To complete the analysis of this time-static and nearly continuous (a<<spatial modulation period) transmission line structure 12, a gray scale plot log ABS [$f_s(k_N, w_N)$] for the fixed real part of the wave vector $k_N$ can be obtained while varying the imaginary part of the wave vector $k_N$. The real part of the wave vector $k_N$ is fixed at the bandgaps shown in FIGS. 2 and 3, and vary the imaginary part of the wave vector $k_N$ to determine the strength of wave attenuation at a particular frequency $w_N$.

Figure 4:
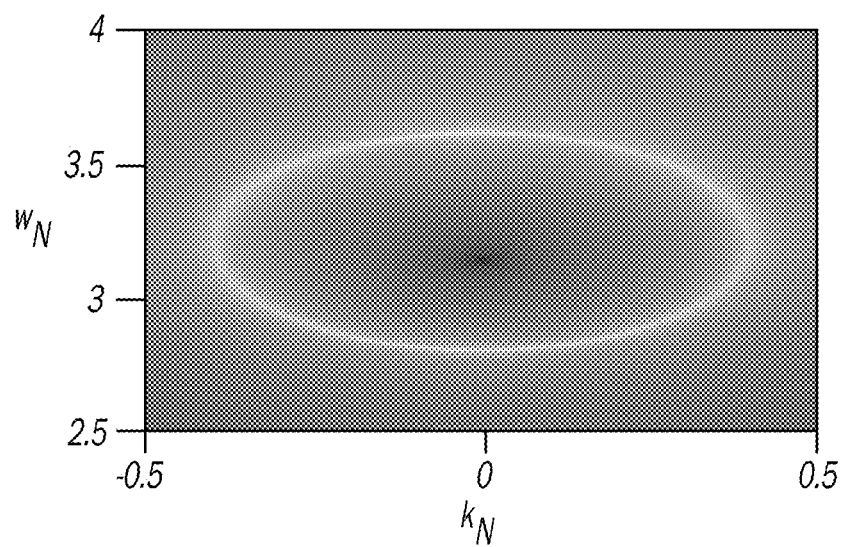
FIG. 4 is a graph with normalized imaginary components of a wave vector on the horizontal axis and normalized frequency on the vertical axis showing a gray scale plot of the dispersion of an imaginary part of the wave vector on a non-reciprocal time and spatially modulated finite size unit cell transmission line having a fixed part of the real wave vector using a first order harmonic approximation.
Figure 5:
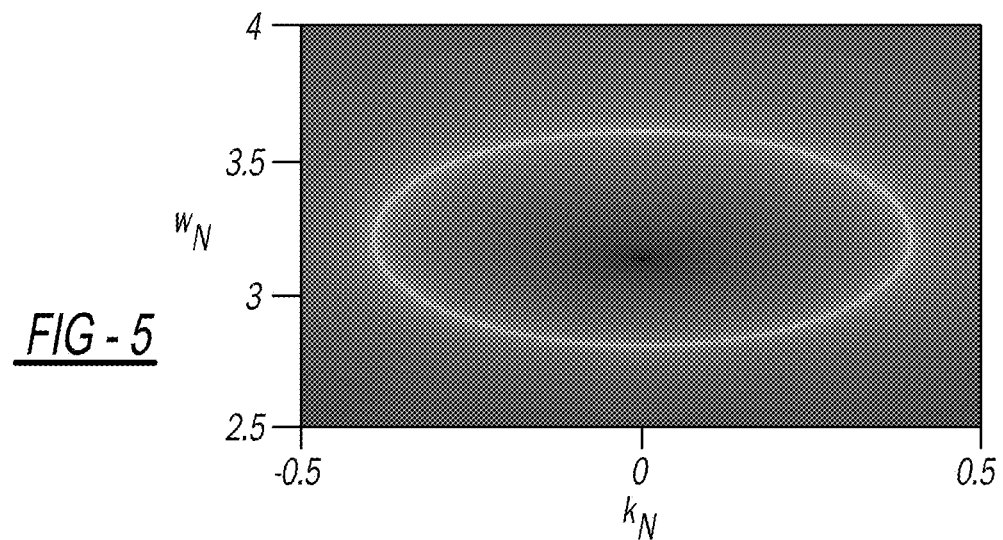
FIG. 5 is a graph with a normalized imaginary component of a wave vector on the horizontal axis and normalized frequency on the vertical axis showing a gray scale plot of the dispersion of an imaginary part of the wave vector on a non-reciprocal time and spatially modulated finite size unit cell transmission line having a fixed part of the real wave vector at the first band gap and using a second order harmonic approximation.
Figure 6:
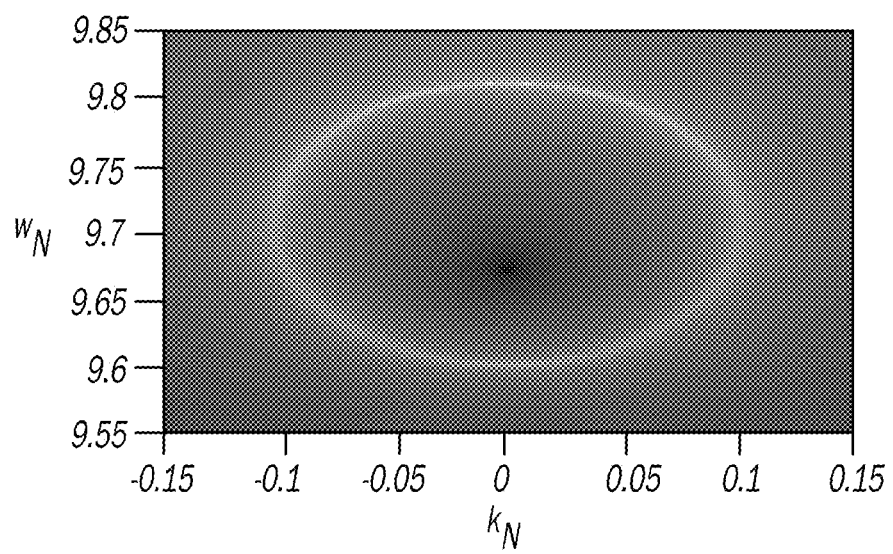
FIG. 6 is a graph with a normalized imaginary component of a wave vector on the horizontal axis and normalized frequency on the vertical axis showing a gray scale plot of the dispersion of an imaginary part of the wave vector on a non-reciprocal time and spatially modulated finite size unit cell transmission line having a fixed part of the real wave vector at the first band gap using a second order harmonic approximation.

FIGS. 4, 5 and 6 are graphs with the complex wave vector $k_N$ on the horizontal axis and the frequency $w_N$ on the vertical axis showing a gray scale plot for dispersion of the imaginary part of the wave vector $k_N$ on the non-reciprocal time and spatially modulated finite size unit cell transmission line having a fixed real part of the wave vector $k_N$ at the first band gap showing the gray scale plot of log ABS [$f_s(k_N, w_N)$] with the fixed real part of the wave vector $k_N$ that represents the exponential strength of the attenuation of the component of the Floquet expanded wave solution at a frequency within the band gap. The real part of the wave vector $k_N$ is adjusted to minimize ABS [$f_s(k_N, w_N)$], and is then fixed at that value for the gray scale plots. The attenuation (maximum of the imaginary part of the wave vector $k_N$) for the first order and second order approximations are the same, as shown in FIGS. 4 and 5. This first gap occurs at the Brillouin boundary of the real part of the wave vector $k_N=\pi$, as expected. The second order gap, shown at a higher frequency range in FIG. 6, occurs at a slightly larger real part of the wave vector $k_N$ due to the somewhat large modulation factor M relative to the second order approximation.

FIGS. 4, 5 and 6 show both positive and negative values for the imaginary part of the wave vector $k_N$. In order to avoid runaway solutions in this time-static example (no external energy sources) for the fixed positive real parts of the wave vectors $k_N$'s, the positive value of the imaginary part of the wave vector $k_N$ is obtained, while for the fixed negative real part of the wave vectors $k_N$'s the negative value of the imaginary part of the wave vector $k_N$ is obtained.

As discussed above, the utility of plotting $f_s(k_N, w_N)$ was established to describe both dispersion and attenuation of a continuous spatially modulated transmission line. The impact of the finite unit cell length a on the dispersion in the time-static transmission line structure 12 can be considered. For the varactor-based transmission line structure 12, this assumption is non-physical unless the varactors are replaced with fixed capacitors that periodically vary between the unit cells 14 with a period of $\lambda_m=2\pi/k_m$.

Figure 7:
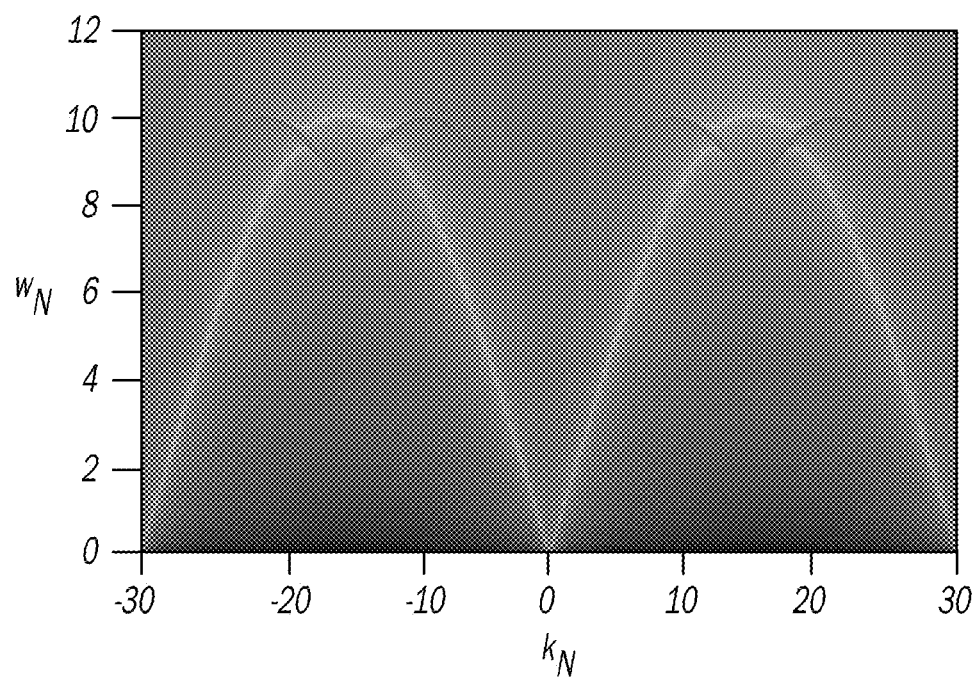
FIG. 7 is a graph with normalized real wave vector on the horizontal axis and normalized frequency on the vertical axis showing dispersion curves for a real part of the wave vector on a non-reciprocal time and spatially modulated finite size unit cell transmission line having an upper frequency cut-off.
Figure 8:
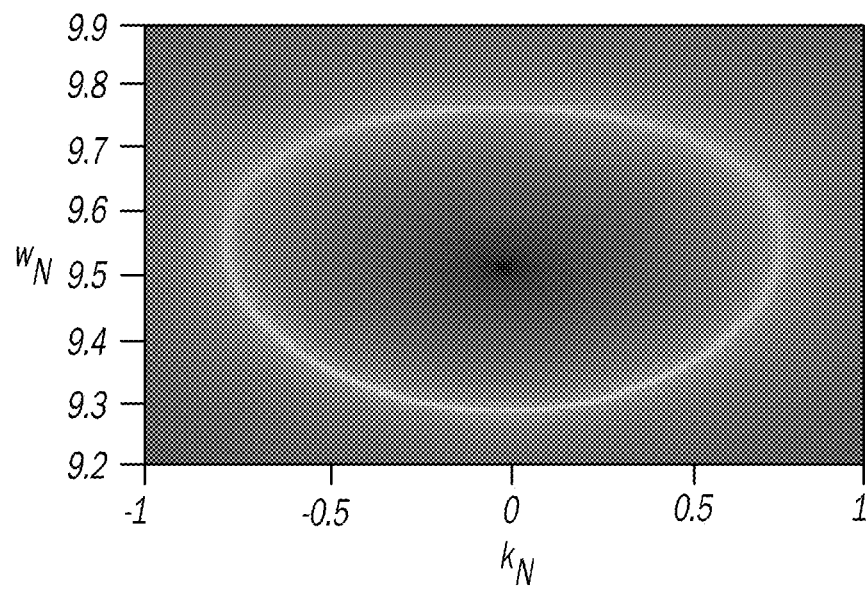
FIG. 8 is a graph with a normalized imaginary component of a wave vector on the horizontal axis and normalized frequency on the vertical axis showing dispersion curves for a fixed real part of the wave vector on a non-reciprocal time and spatially modulated finite size unit cell transmission line having an upper gap imaginary wave vector at a fixed real wave vector.
Figure 9:
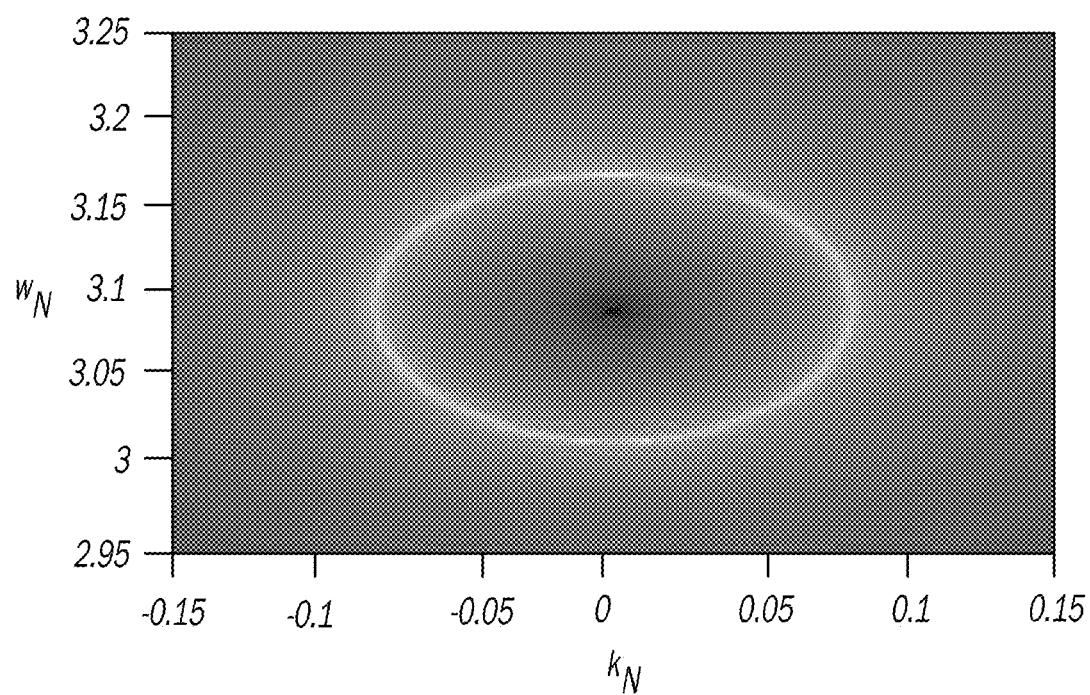
FIG. 9 is a graph with a normalized imaginary component of a wave vector on the horizontal axis and normalized frequency on the vertical axis showing dispersion curves for a real part of the wave vector on a non-reciprocal time and spatially modulated finite size unit cell transmission line having a lower gap imaginary wave vector at a fixed real wave vector.

FIGS. 7, 8 and 9 are graphs with the complex wave vector $k_N$ on the horizontal axis and the frequency $w_N$ on the vertical axis showing dispersion curves for the real part of the wave vector $k_N$ on a non-reciprocal time and spatially modulated finite size unit cell transmission line with finite unite cell length for M=0.1, r=0 and p=0.2. FIG. 7 shows the real part of the wave vector $k_N$ dispersion curves for the first harmonic approximation along with the imaginary part of the wave vector $k_N$ plots for the two bandgaps. What follows does not fundamentally differ for the second harmonic approximation. A relatively weak modulation constant M=0.1 was chosen to highlight the dispersion arising mostly from the finite unit cell 2 14. The dispersion exhibits an upper cutoff frequency, along with two bandgaps formed by the intersection of the zero order dispersion line with the −1 and +1 harmonics. The lower frequency gap in FIGS. 7, 8 and 9 is the same as the gap seen in FIG. 4 at $k_N=\pi$, but a second gap now appears due to a first order harmonic curving over due to the cutoff frequency, and intersecting with the zero order dispersion curve. The relative attenuation strengths of the two gaps can be seen in FIGS. 8 and 9, with the gap width and strength significantly larger for the "new" gap at the frequency $w_N$=9.5.

Figure 10:
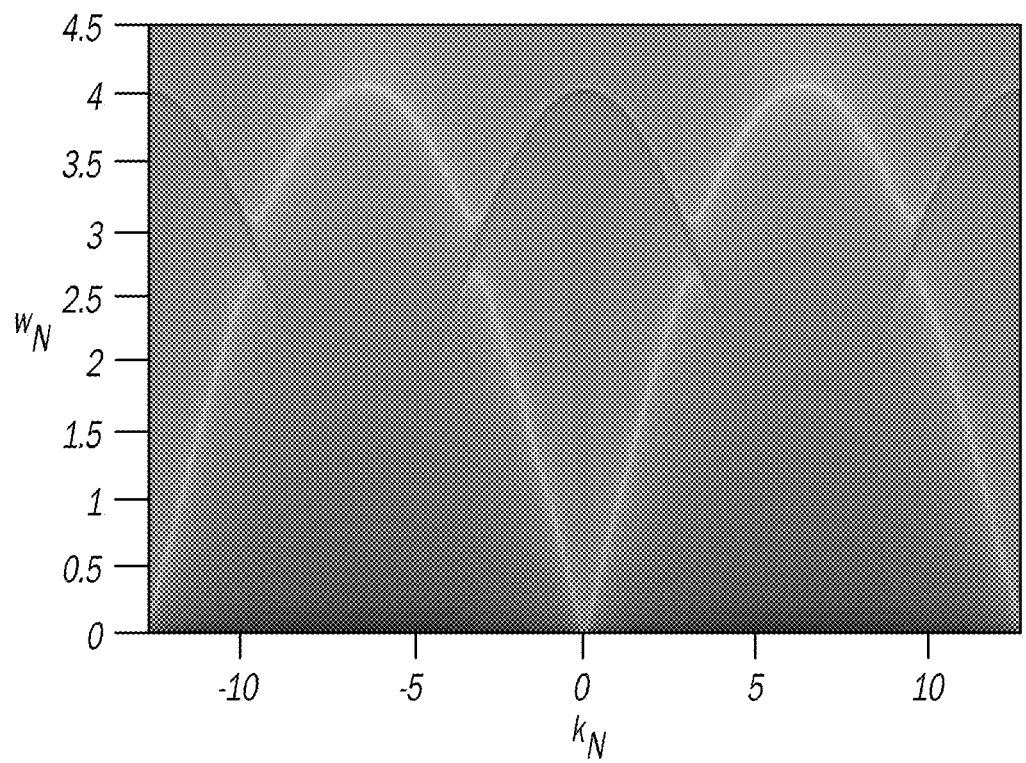
FIG. 10 is the graph shown in FIG. 7, but with a p factor equal to 0.5.
Figure 11:
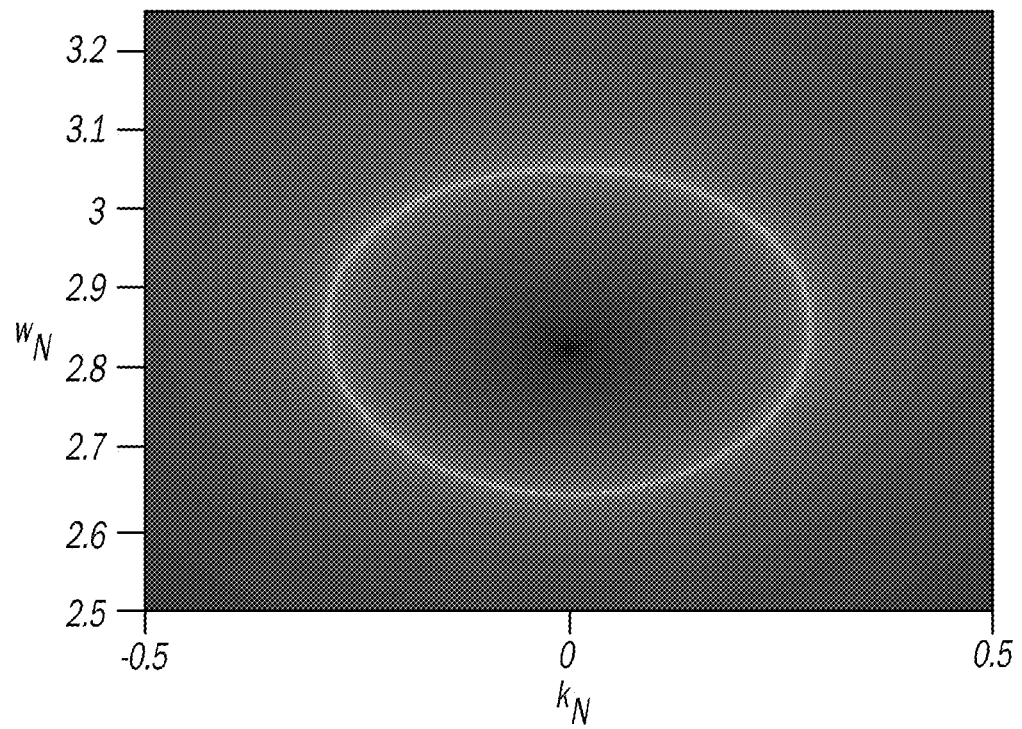
FIG. 11 shows how the graphs shown in FIGS. 8 and 9 can be coalesced into one gap.

The lower gap shown in FIG. 9 remains at $k_N=\pi$, but the upper gap shown in FIG. 8 changes its position of the real part of the wave vector $k_N$ with the p factor introduced in equation (9). Another way to define the p factor is the ratio of the unite cell length a to the spatial modulation wavelength ($\lambda_m=2\pi/k_m$). The upper and lower gaps can be made to coincide at the real part of the wave vector $k_N=\pi$ by setting p=0.5, as shown in FIGS. 10 and 11, where FIG. 10 is the graph shown in FIG. 7, but with the p factor equal to 0.5, and FIG. 11 is the graphs shown in FIGS. 8 and 9 that have been coalesced into one gap. When the factor p>0.5 the upper gap drops below the fixed real part of the wave vector $k_N=\pi$ gap and now becomes the lower gap. An important point to note is that this double band gap feature persists when including second order harmonic terms into the calculations for small to moderate values of the modulation factor M. This means that first order harmonic analysis will be sufficient for calculations of typical transmission line structure 12.

The time-static frequency $w_m=0$ restriction is removed and placed on the finite unit cell transmission line structure 12 and allows the r factor to be non-zero. This means that a modulation wave can be injected whose amplitude is strong enough to vary the varactor capacitance in space and time with the frequency $w_m$ and the phase velocity $v_m=w_m/k_m$. When the unit cell length a is infinitely small, the non-reciprocal behavior can be recovered. When the unit cell length a is allowed for, then the double bandgap structure shown in FIGS. 7, 8 and 9 can be recovered, but with a non-reciprocity degree that depends on the value of the r factor. As in the time-static case, the wave vector $k_N$ position of the upper gap can be adjusted by adjusting the p factor. However, because the transmission line structure 12 is now non-reciprocal, the relative positions of the two bandgaps are different depending on whether the transmission signal is propagating in the +k or −k direction.

Figure 12:
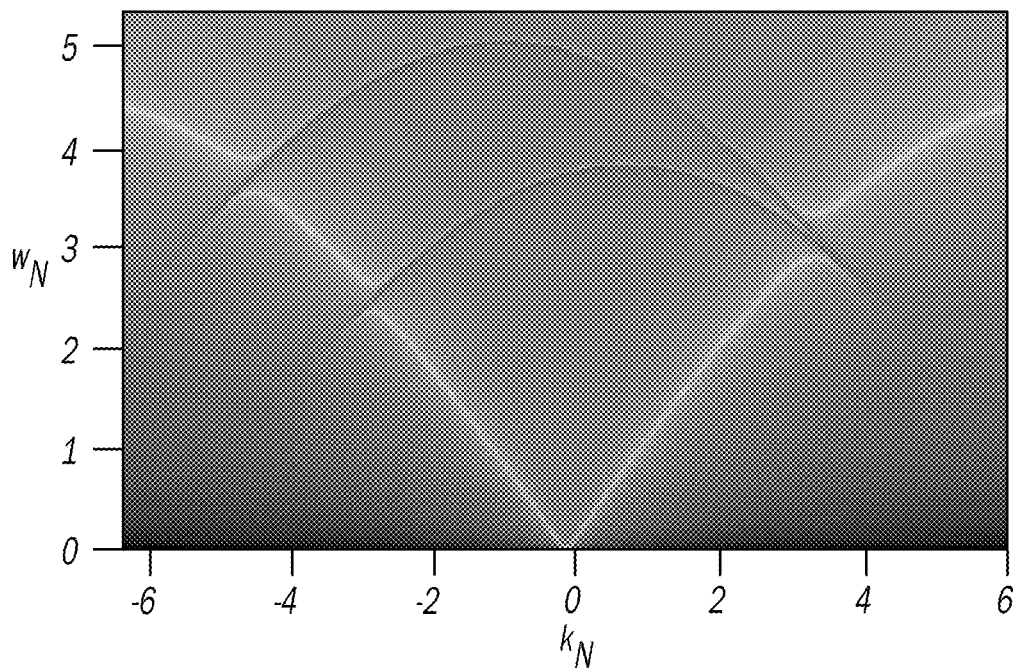
FIG. 12 is a graph with normalized real wave vector on the horizontal axis and normalized frequency on the vertical axis showing dispersion curves of the wave vector for a non-reciprocal time and spatially modulated finite size unit cell transmission line.
Figure 13:
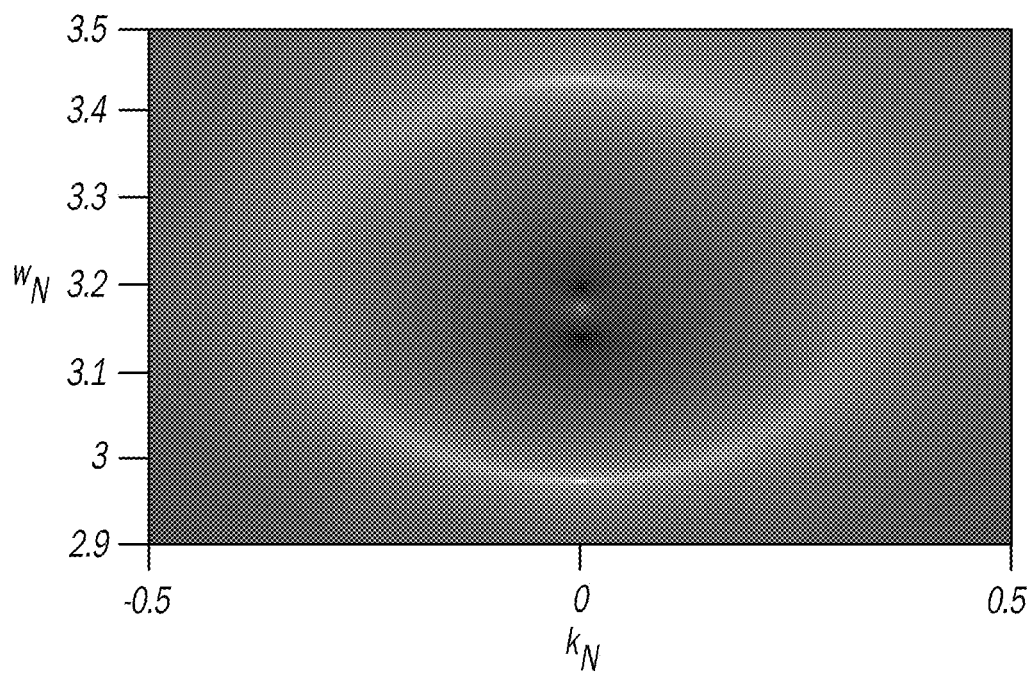
FIG. 13 is a graph with a normalized imaginary component of the wave vector on the horizontal axis and normalized frequency on the vertical axis showing dispersion curves for a non-reciprocal time and spatially modulated finite size unit cell transmission line.

A particularly interesting example is when the p factor is adjusted so that the two bandgaps coalesce into one gap for a +k propagating signal. FIG. 12 is a graph with the complex wave vector $k_N$ on the horizontal axis and the frequency $w_N$ on the vertical axis showing a dispersion plot of the imaginary part of the wave vector $k_N$ for a time-static but spatially modulated transmission line, and FIG. 13 is a graph with the complex wave vector $k_N$ on the horizontal axis and the frequency $w_N$ on the vertical axis showing a calculated band structure for dispersion curves on a non-reciprocal finite unit cell transmission line for M=0.20, r=0.10 and p=0.44.

Figure 14:
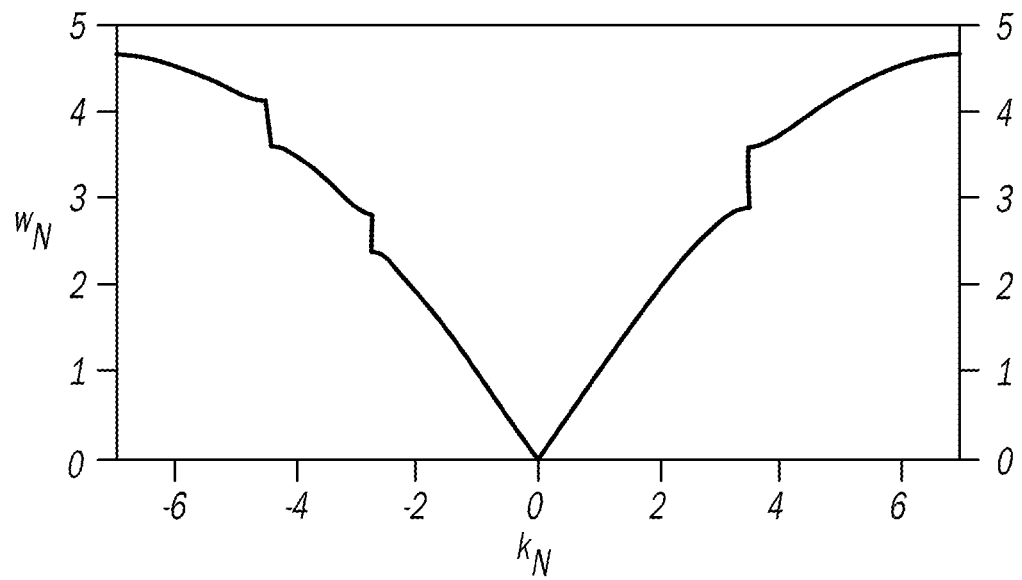
FIG. 14 is a graph with normalized real wave vector on the horizontal axis and normalized frequency on the vertical axis showing the numerically calculated band structure for dispersion curves for a non-reciprocal time and spatially modulated finite size unit cell transmission line.
Figure 15:
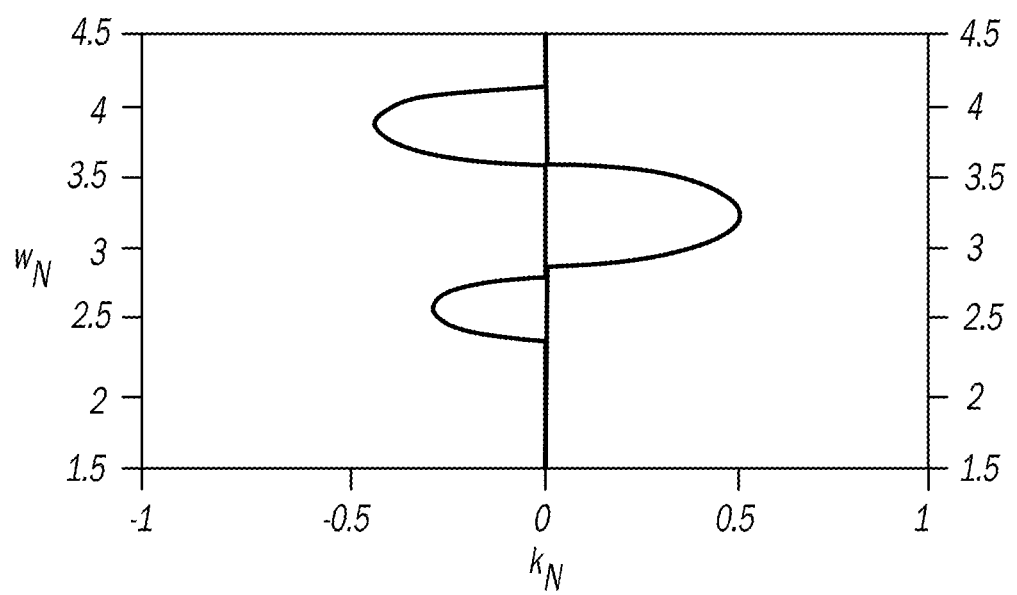
FIG. 15 is a graph with an imaginary component of the wave vector on the horizontal axis and normalized frequency on the vertical axis showing the dispersion curve band gaps for a fixed real part of the wave vectors on a non-reciprocal time and spatially modulated finite size unit cell transmission line.

The non-reciprocal bandgap symmetry is better illustrated by numerically solving $f_s(k_N, w_N)=0$ in equation (7) for the complex wave vector $k_N$ using MATLAB fsolve and following the local solution. FIG. 14 is a graph with the complex wave vector $k_N$ on the horizontal axis and the frequency $w_N$ on the vertical axis showing a calculated band structure for the dispersion curves for −k and +k propagation modes on a non-reciprocal time and spatially modulated finite size unit cell transmission line, and displaying the non-reciprocal bandgaps. FIG. 15 is a graph with the complex wave vector $k_N$ on the horizontal axis and the frequency $w_N$ on the vertical axis showing the calculated imaginary part of the wave vectors $k_N$ for the fixed real part of the wave vector $k_N$'s at the gaps on a calculated band structure for a non-reciprocal time and spatially modulated finite size unit cell transmission line. There is a significant increase in the value of the maximum imaginary value of the wave vector $k_N$ as compared with a time-space modulated transmission line with a near-zero length unit cell. This will result in stronger attenuation of a single wave with frequencies within the stop band and subsequently reduces the length, i.e., the number of the unit cells 14, needed for good signal isolation.

For this particular choice of transmission line parameters, a bandpass filter can be constructed with non-reciprocal properties. In this example, the transmission signal can propagate in the −k direction between the two gaps depicted on the left side of FIG. 15, but transmission signals traveling in the +k direction within this band region are effectively blocked. This behavior can be automatically reversed by reversing the direction of the modulation signal.

An example of the non-reciprocal band pass filter 10 with realistic dimensions, materials and signal parameters is provided as follows. For a modulation pump frequency of $w_m$=6.28 GHz and $k_m$=6.58 cm$^{-1}$, an unmodulated relative permittivity $\varepsilon_r$=9.8 and p=0.44, and a unit cell size a=0.420 cm, FIG. 15 gives a center band gap of $\Delta f(\Delta w/2\pi)$=5.17 GHz with a central gap width $\Delta f$=1.18 GHz, an upper gap width of 0.94 GHz and a lower gap width of 0.67 GHz.

Also of interest is the impact of the finite unit cell dispersion on the Floquet expansion coefficients $V_s$. For the first order harmonic approximation, these complex coefficients $V_s$ are given by:

$$V_s = -\frac{V_0}{D_s(w_N, k_N)}, \qquad (10)$$

where the frequency $w_N$ and the wave vector $k_N$ are the solution pairs to the dispersion condition $f_s(k, w)=0$ in equation (7), and where the coefficients $V_0$ is arbitrarily set to unity.

Figure 16:
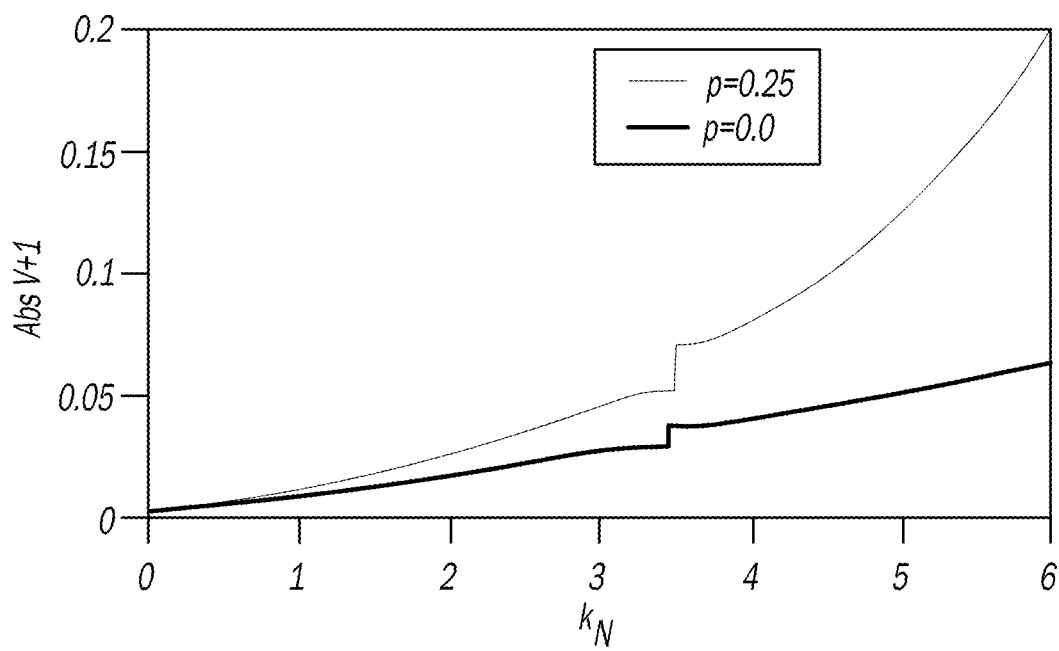
FIG. 16 is a graph with normalized real wave vector on the horizontal axis and the absolute value of the Floquet expansion coefficients on the vertical axis for a forward moving signal wave on a non-reciprocal time and spatially modulated finite size unit cell transmission line for a harmonic equal to +1.
Figure 17:
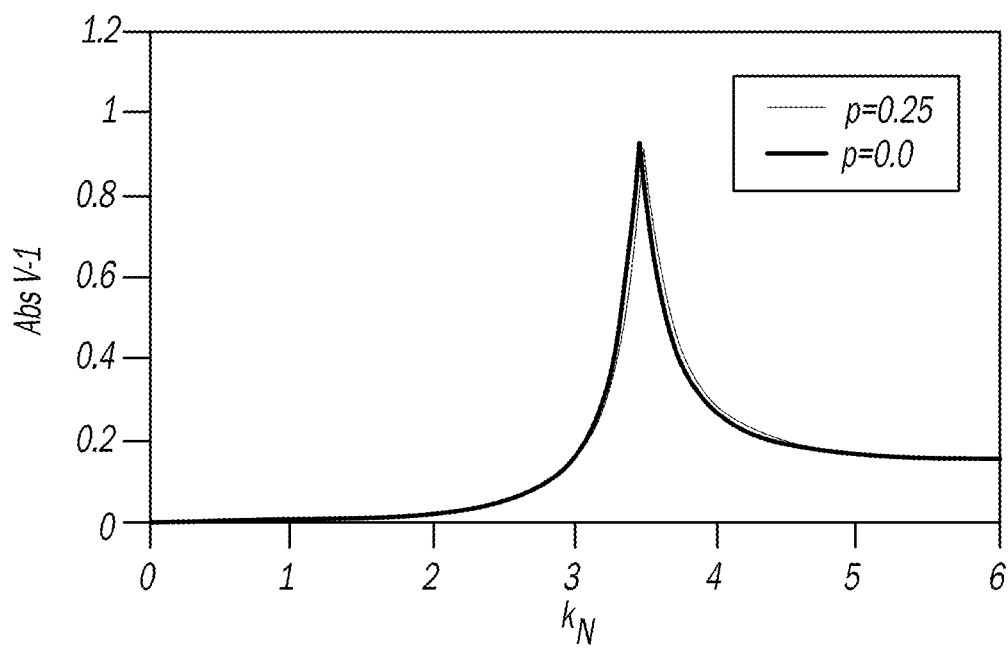
FIG. 17 is a graph with the normalized real wave vector on the horizontal axis and the absolute value of the Floquet expansion coefficients on the vertical axis for a forward moving signal wave on a non-reciprocal time and spatially modulated finite size unit cell transmission line for a harmonic equal to −1.
Figure 18:
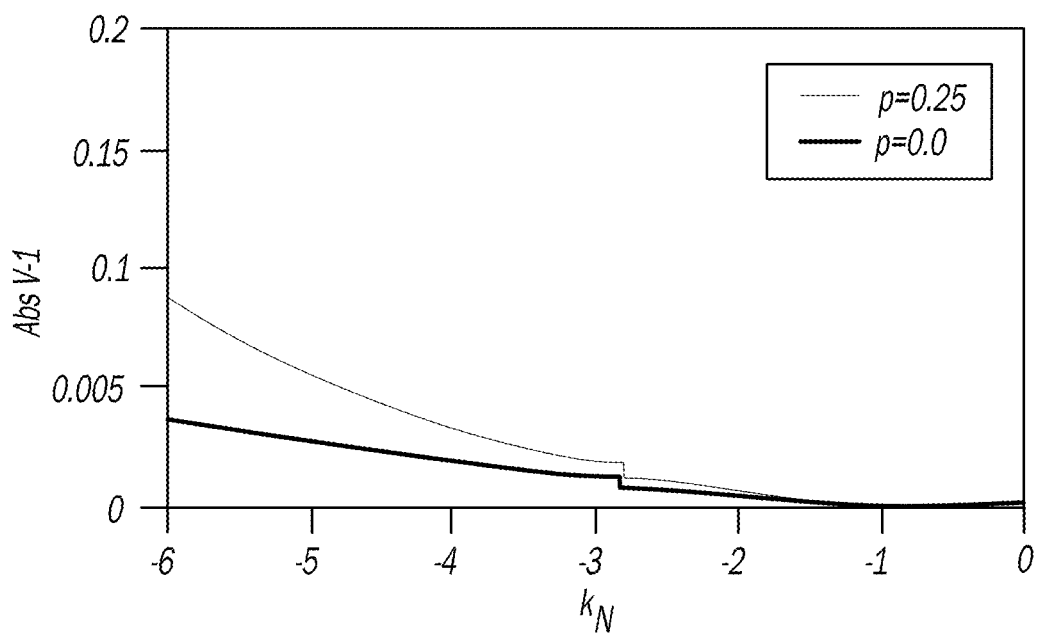
FIG. 18 is a graph with the normalized real wave vector on the horizontal axis and the absolute value of the Floquet expansion coefficients on the vertical axis for a backwards moving signal wave on a non-reciprocal time and spatially modulated finite size unit cell transmission line for a harmonic equal to −1.
Figure 19:
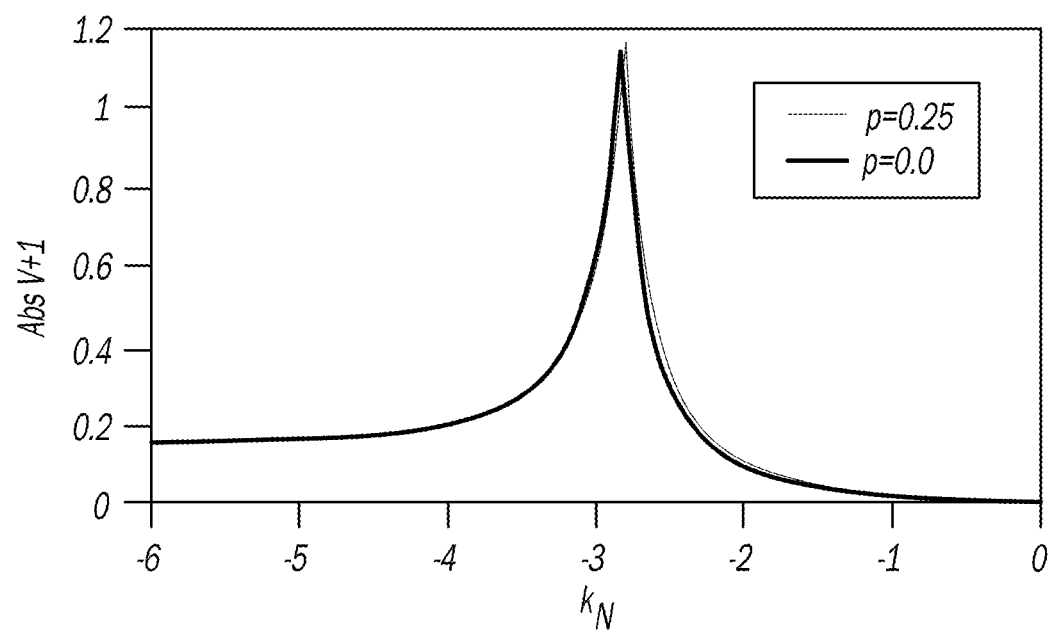
FIG. 19 is a graph with the normalized real wave vector on the horizontal axis and the absolute value of the Floquet expansion coefficients on the vertical axis for a backwards moving signal wave on a non-reciprocal time and spatially modulated finite size unit cell transmission line for a harmonic equal to +1.

As an example, the coefficients for a continuous transmission line with the finite unit cell length a can be compared. FIGS. 16-19 are graphs with the complex wave vector $k_N$ on the horizontal axis and the absolute value of the Floquet expansion coefficients $V_s$ on the vertical axis on a space-time modulated transmission line and having graph lines for the parameters M=0.30, r=0.10 and p=0 or 0.25. FIG. 16 shows the +k direction values, FIG. 17 shows the −k direction values, FIG. 18 shows the s=−1 harmonics and FIG. 19 shows the s=+1 harmonics. For forward propagating signals with +k values below the bandgap, a significant enhancement in the s=+1 harmonic for the finite unit cell case can be provided, as compared to the continuous transmission line. This is also true for the s=−1 harmonic for backward −k signals, but to a lesser extent. Conversely, there is little change for either the −1 harmonic for +k signals or the s=+1 harmonic for −k signals.

The space-time modulated transmission line structure 12 has been extended over the art to include a finite unit cell length a as a way to dispersion-engineer reciprocity breaking for isolator applications. The Bloch-Floquet method provides a complete harmonic expansion of the solution set and can be used to justify the use of a limited set of harmonic terms. Both the frequency $w_N$ and the wave vector $k_N$ grid gray-scale plotting and a complex solver in MATLAB were used to illustrate the dispersion band structure for a variety of transmission line parameters. A time-static, purely spatial modulation with finite unit cell dispersion results in a reciprocal double band gap structure that is tunable by controlling the ratio of the of the unit cell length a to the spatial modulation period. Introducing time and space modulation results in a non-reciprocal double band gap structure that can be tuned to exhibit unique band pass and stop band behavior.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A non-reciprocal band pass filter comprising:
 a transmission line including a plurality of repeating finite size unit cells, where each unit cell has a predetermined length and includes an inductor and a varactor;
 a signal source providing a transmission signal that propagates on the transmission line; and
 a modulation source providing a modulation signal that controls and modulates a capacitance of the varactors, wherein a ratio between the predetermined length of the unit cells and a wavelength of the modulation signal is selected to provide propagation modes that allow the transmission signal to propagate along the transmission line in one direction in a controlled pass band, but prevent the transmission signal from propagating along the transmission line in the controlled pass band in an opposite direction.

2. The filter according to claim 1 wherein the transmission line includes a double band configured circuit.

3. The filter according to claim 1 wherein the transmission line is a time-static but spatially modulated transmission line.

4. The filter according to claim 1 wherein the inductors are constant value inductors.

5. The filter according to claim 1 wherein the modulation source propagates the modulation signal in the same direction as the transmission signal.

6. The filter according to claim 1 wherein the modulation source propagates the modulation signal in an opposite direction as the transmission signal.

7. The filter according to claim 1 wherein the filter is part of an isolator, radar system or circulator.

8. A non-reciprocal band pass filter comprising:
 a time-static but spatially modulated transmission line including a plurality of repeating finite size unit cells and a double band configured circuit, where each unit cell has a predetermined length and includes a constant value inductor and a varactor;
 a signal source providing a transmission signal that propagates on the transmission line; and
 a modulation source providing a modulation signal that controls and modulates a capacitance of the varactors, wherein a ratio between the predetermined length of the unit cells and a wavelength of the modulation signal is selected to provide propagation modes that allow the transmission signal to propagate along the transmission line in one direction in a controlled pass band, but prevent the transmission signal from propagating along the transmission line in the controlled pass band in an opposite direction.

9. The filter according to claim 8 wherein the modulation source propagates the modulation signal in the same direction as the transmission signal.

10. The filter according to claim 8 wherein the modulation source propagates the modulation signal in an opposite direction as the transmission signal.

11. The filter according to claim 8 wherein the filter is part of an isolator, radar system or circulator.

12. A method for allowing a transmission signal to propagate along a transmission line in one direction, but prevent it from propagating along the transmission line in an opposite direction, said transmission line including a plurality of repeating finite size unit cells, where each unit cell has a predetermined length and includes an inductor and a varactor, said method comprising selecting a ratio between the predetermined length of the unit cells and a wavelength of a modulation signal to provide propagation modes that allow the transmission signal to propagate along the transmission line in the one direction in a controlled pass band, but prevent the transmission signal from propagating along the transmission line in the controlled pass band in the opposite direction.

13. The method according to claim 12 wherein the transmission line includes a double band configured circuit.

14. The method according to claim 12 wherein the transmission line is a time-static and spatially modulated transmission line.

15. The method according to claim 12 wherein the modulation signal controls the capacitance of the varactors.

16. The method according to claim 12 wherein the inductors are constant value inductors.

17. The method according to claim 12 wherein the transmission line is part of a non-reciprocal band pass filter.

18. The method according to claim 12 wherein the transmission signal and the modulation signal propagate along the transmission signal in the same direction.

19. The method according to claim 12 wherein the transmission signal and the modulation signal propagate along the transmission signal in opposite directions.

\* \* \* \* \*